United States Patent
Lee (10) Patent No.: US 7,296,128 B2
(45) Date of Patent: Nov. 13, 2007

(54) NONVOLATILE MEMORY WITH ERROR CORRECTION FOR PAGE COPY OPERATION AND METHOD THEREOF

(75) Inventor: Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 320 days.

(21) Appl. No.: 10/817,061

(22) Filed: Apr. 2, 2004

(65) Prior Publication Data

US 2004/0202034 A1 Oct. 14, 2004

(30) Foreign Application Priority Data

Apr. 3, 2003 (KR) ............... 10-2003-0021114

(51) Int. Cl.
*G06F 12/16* (2006.01)
(52) U.S. Cl. .................................... 711/165
(58) Field of Classification Search ................ 711/103; 714/723, 804; 365/185; 341/50
See application file for complete search history.

(56) References Cited

U.S. PATENT DOCUMENTS

| | | | | |
|---|---|---|---|---|
| 4,358,848 A | * | 11/1982 | Patel | ............ 714/761 |
| 4,453,251 A | * | 6/1984 | Osman | ............ 714/804 |
| 5,996,041 A | * | 11/1999 | Kim | ............ 711/103 |
| 6,058,047 A | * | 5/2000 | Kikuchi | ............ 365/185.33 |
| 6,266,273 B1 | * | 7/2001 | Conley et al. | ............ 365/185.11 |
| 6,728,913 B1 | * | 4/2004 | Parker | ............ 714/723 |
| 6,868,007 B2 | * | 3/2005 | Hasegawa et al. | ............ 365/185.09 |
| 2001/0050622 A1 | * | 12/2001 | Hewitt et al. | ............ 341/50 |
| 2003/0117846 A1 | * | 6/2003 | Hasegawa et al. | ............ 365/185.09 |

FOREIGN PATENT DOCUMENTS

WO    WO 02/17330 A2    2/2002

* cited by examiner

*Primary Examiner*—Pierre Bataille
*Assistant Examiner*—Paul Schlie
(74) *Attorney, Agent, or Firm*—Marger Johnson & McCollom, P.C.

(57) ABSTRACT

The disclosure is a NAND flash memory with the function of error checking and correction during a page copy operation. The NAND flash memory is able to prohibit transcription of erroneous bits to a duplicate page from a source page. Embodiments of the inventive flash memory include a correction circuit for correcting bit errors of source data stored in a page buffer, a circuit configured to provide the source data to the correction circuit and to provide correction data to the page buffer, and a copy circuit configured to copy the source data to the page buffer, and to store the correction data in the other page from the page buffer.

20 Claims, 9 Drawing Sheets

Fig. 1

(Prior Art)

NONVOLATILE MEMORY WITH ERROR CORRECTION FOR PAGE COPY OPERATION AND METHOD THEREOF

This application claims priority from Korean Patent Application No. 2003-21114, filed on Apr. 3, 2003, the contents of which are herein incorporated by reference in their entirety.

FIELD OF THE INVENTION

This disclosure generally relates to nonvolatile flash memories and more specifically, to flash memories for reliable page copy operations with error correcting functions and their methods of operating therein.

BACKGROUND OF THE INVENTION

Flash memories are commonly applicable to mass storage subsystems for electronic devices employed in mobile communications, game sets, and so forth. Such subsystems are usually implemented as either removable memory cards that can be inserted into multiple host systems or as non-movable embedded storage within the host systems. In both implementations, the subsystem includes one or more flash devices and often a subsystem controller.

Flash memories are composed of one or more arrays of transistor cells, each cell capable of non-volatile storage of one or more bits of data. Therefore, flash memories do not require power to retain the data programmed therein. Once programmed however, a cell must be erased before it can be reprogrammed with a new data value. These arrays of cells are partitioned into groups to provide for efficient implementation of read, program and erase functions. The typical flash memory architecture for mass storage arranges large groups of cells into erasable blocks. Each block is further partitioned into one or more addressable sectors that are the basic unit for read and program functions.

Flash memories basically have their own functional operations of reading, writing (or programming), and erasing. Flash memories additionally extend their facilities to practice a page copy operation (or a copy-back operation). The page copy operation is to transcript data stored in a page assigned to a specific address to another page assigned to another address. During the page copy, data stored in a page of a specific address are transferred to a page buffer and then the data remaining in the page buffer are written into another page assigned to another address by way of a programming process without reading the data out of the flash memory. The page copy function eliminates a need of reading-out data to be written and of loading data to be written from the external source of the flash memory, which is advantageous to enhancing systemic data rates associated with the subsystem controller.

Figure 1:
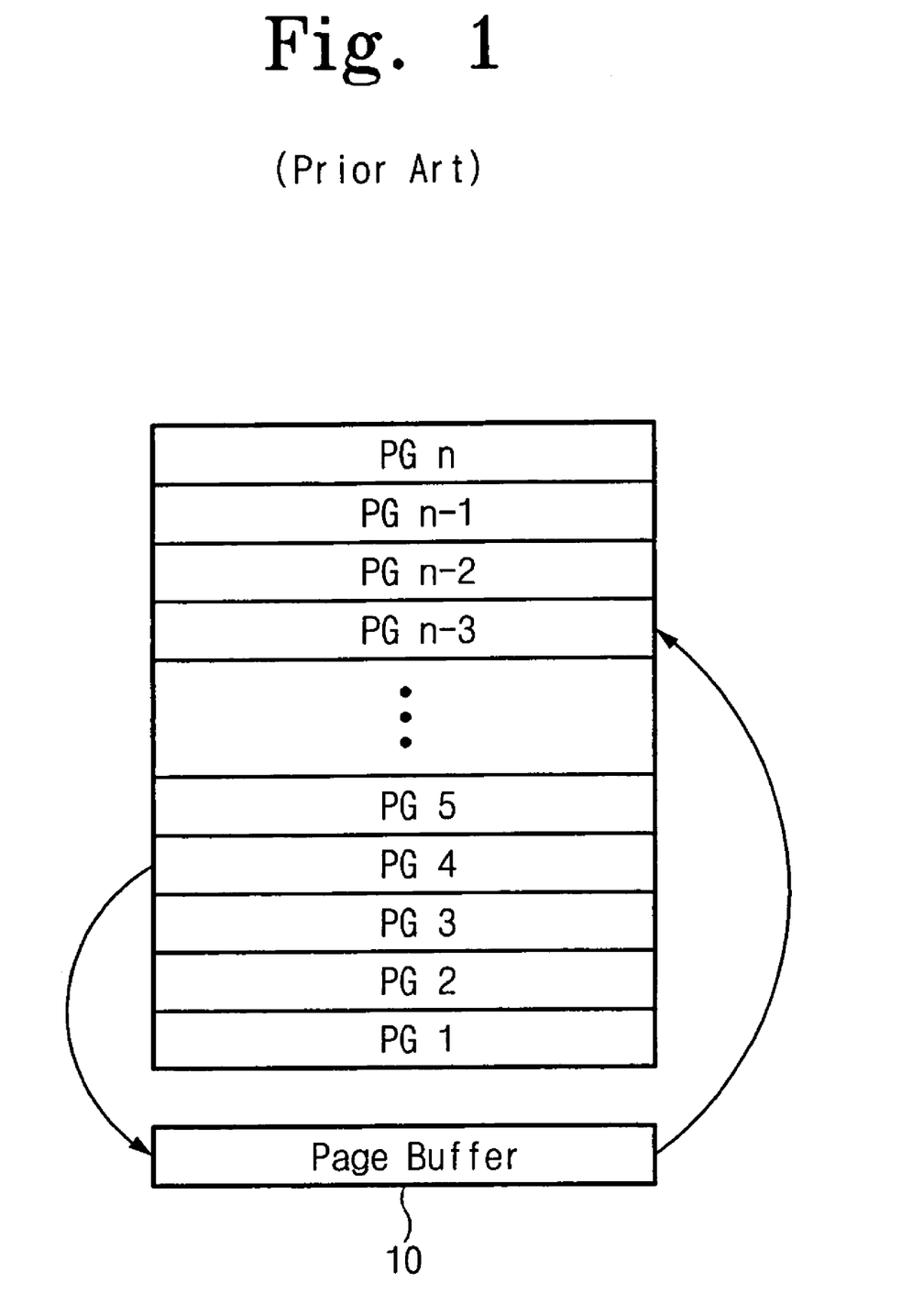
FIG. 1 is a block diagram illustrating a conventional page copy-back feature in a NAND flash memory device.

However, unfortunately, it may occur that the pages to be copied and to be written have their own error bits. As shown in FIG. 1, assuming that a page PG4 is to be copied and a page PGn-3 is to be written, both pages each having one error bit, the data stored in the page PG4 is transferred to the page buffer 10 and then written into the page PGn-3 from the page buffer 10. As a result of the page copy operation, two error bits are included in the page PGn-3. Because most flash memory controllers used as subsystem controllers in a card-type memory are usually only designed to correct one-bit error for a page, such a two-bit error in a page may be incapable of being cured after completing the copy back operation.

Although a flash memory controller could be equipped with an error correcting function capable of coping even with the two-bit error per page, it would cause the circuit architecture to be much more complex and thereby deteriorate operational efficiencies in the memory control system.

Embodiments of the invention address these and other limitations of the prior art.

SUMMARY OF THE INVENTION

Embodiments of the present invention provide a nonvolatile memory capable of maintaining the integrity of data through a page copy operation, and a method thereof. Such a nonvolatile memory is capable of preventing a transcription of error bits during a page copy operation.

According to an aspect of the present invention, a nonvolatile memory includes a number of pages storing data; a page buffer temporarily storing data by the page; a circuit for correcting a bit error of source data of a specific one of the pages; circuitry configured to provide the source data to the circuit and to provide amended data to the page buffer from the circuit; and a copy circuit configured to copy the source data into the page buffer and to store the amended data into another page from the page buffer.

The circuit generates new parities from the source data and compares the new parities with the old parities. Additionally, the device includes a circuit for generating column parities for bits composing one byte of the source data; and a circuit for generating line parities for bytes of the source data.

In the embodiment, a nonvolatile memory includes: a data field composed of a number of pages for storing data; a first circuit configured to storing first parities in a predetermined region of the data field, the first parities being generated during a programming operation for the page; a page buffer for temporarily storing data by the page; a second circuit configured to copy source data stored in a specific one of the pages into the page buffer; a third circuit configured to generate second parities from the source data stored in the page buffer; and a fourth circuit configured to transfer amended data of the source data to the page buffer in response to a result of comparing the first parities with the second parities. A fifth circuit is further included to store the amended data held in the page buffer into another page of the pages.

In the embodiment, a method of transferring source data of a specific page, the source data containing old parities, to another page in a nonvolatile memory having a page buffer temporarily storing data by the page, includes the processes of: storing the source data into the page buffer; generating new parities from the source data stored in the page buffer; comparing the old parities with the new parities; creating modified data of the source data in response to a result of the comparing; and moving the modified data to the another page through the page buffer. From the embodiment, it is available to inform an error status by the comparing result of the outside of the memory.

In this embodiment, a nonvolatile memory includes: a data storage field composed of a number of pages storing data; a page buffer for storing data of a specific one of the pages, being connected to the data storage field; and error correction circuit connected to the page buffer and including: a bit error detector configured to detect an bit error of the data of the specific page; and a bit error corrector configured to amend the bit error. The bit error detector includes: a parity generator for creating new parities from the data stored in the page buffer; and a comparator for generating error address information by comparing the new parities with old parities of the data.

The error address information is referred by the bit error corrector to correct the data and to transfer amend data to the page buffer. The modified data are transcribed into the specific page and another page.

The present invention will be better understood from the following detailed description of the exemplary embodiment thereof taken in conjunction with the accompanying drawings.

BRIEF DESCRIPTION OF THE DRAWINGS

The forgoing and other features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENT

It should be understood that the description of the preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

A flash memory applicable to the present invention is embodied on a NAND flash memory, adaptable to be embedded in portable electronic devices such as integrated circuit cards, in which a number of memory cells are arranged in the pattern of strings coupled to a plurality of wordlines and bitlines disposed in a matrix of rows and columns.

A NAND flash memory according to embodiments of the present invention has a memory cell array divided into a plurality of pages designated by addresses. Each page is formed of a number of memory cells coupled to a wordline and coupled to a plurality of bitlines each by each. The page is a unit of reading and writing.

A NAND flash memory according to embodiments of the present invention is designed to carry out functional operations such as erasing to remove data stored in memory cells, programming to write data in memory cells, reading data out of the memory (i.e. a read-out operation), verifying to check out the status of memory cells after completing the erasing and programming, and page-copying to transcript data of a page into another page without a read-out operation.

A NAND flash memory according to embodiments of the present invention includes a page buffer circuit for temporally storing data to be read from memory cells or loaded from outside the memory in the operations of programming, reading-out, or page-copying. Also including are buffers and decoders for selecting pages or memory cells with addresses supplied from the outside, sense amplifiers for detecting data values, gate circuitry for transferring data from/to the memory cell array to/from input/output channels, and control circuits for managing the operations therein.

Embodiments of to the present invention include an error correcting operation associated with the page copy function.

In this embodiment, the term "read-out" is used to identify an operation of reading data out of the memory, i.e. the state that data from memory cells go out of the memory. The term "copy" is used to identify an operation of transferring data of a specific page into the page buffer, and "transcription" is used to identify an operation of moving the data held in the page buffer into another page. Further, "source data" is used to identify data to be copied with an error bit, and "modified (or correct or amended) data" is used to identify data to be transcribed without any error bit.

Now, practical embodiments of the invention will be explained in conjunction with the drawings FIGS. 2 through 9.

Figure 2:
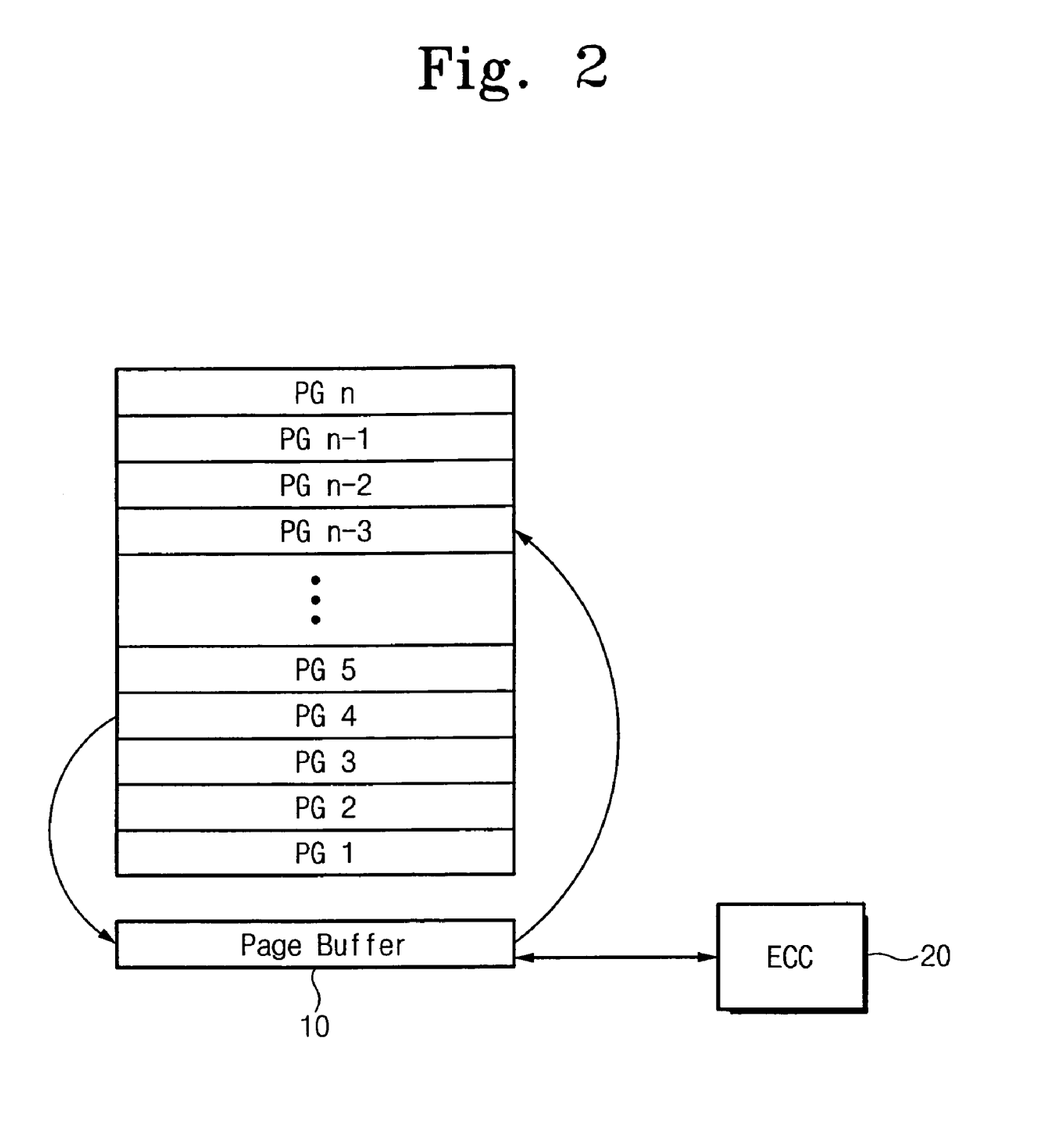
FIG. 2 is a block diagram illustrating a page copy-back feature with error correction according to embodiments of the present invention.

FIG. 2 illustrates a schematic feature of correcting a bit error during a page copy operation mode according to embodiments of the present invention. First, data stored in, for example, the page PG4, i.e., the source data, are loaded into the page buffer 10 by way of a read operation (this reading is distinguishable from the read-out operation used elsewhere in the present specification), which is referred as the "copy" operation. The data stored in the page buffer 10, i.e., the source data of the page PG4 (hereinafter referred as "source page), are put into an error correction circuit 20 to cure an error bit embedded in the source data before they are written into another page (e.g., PGn-3; hereinafter referred to "transcription page"). The data modified by the error correction circuit 20 are transferred back into the page buffer 10 and then written into the page PGn-3. As a result, the page PGn-3 is rendered to be free from the error bit embedded in the source data, preventing from the transcription of an error bit by the source data.

Even if the page PGn-4 to be transcribed has its own error bit, a known function of error correcting may cure the single bit error thereof. More details about the error correcting procedure during the page copy operation will be described hereinbelow.

Figure 3:
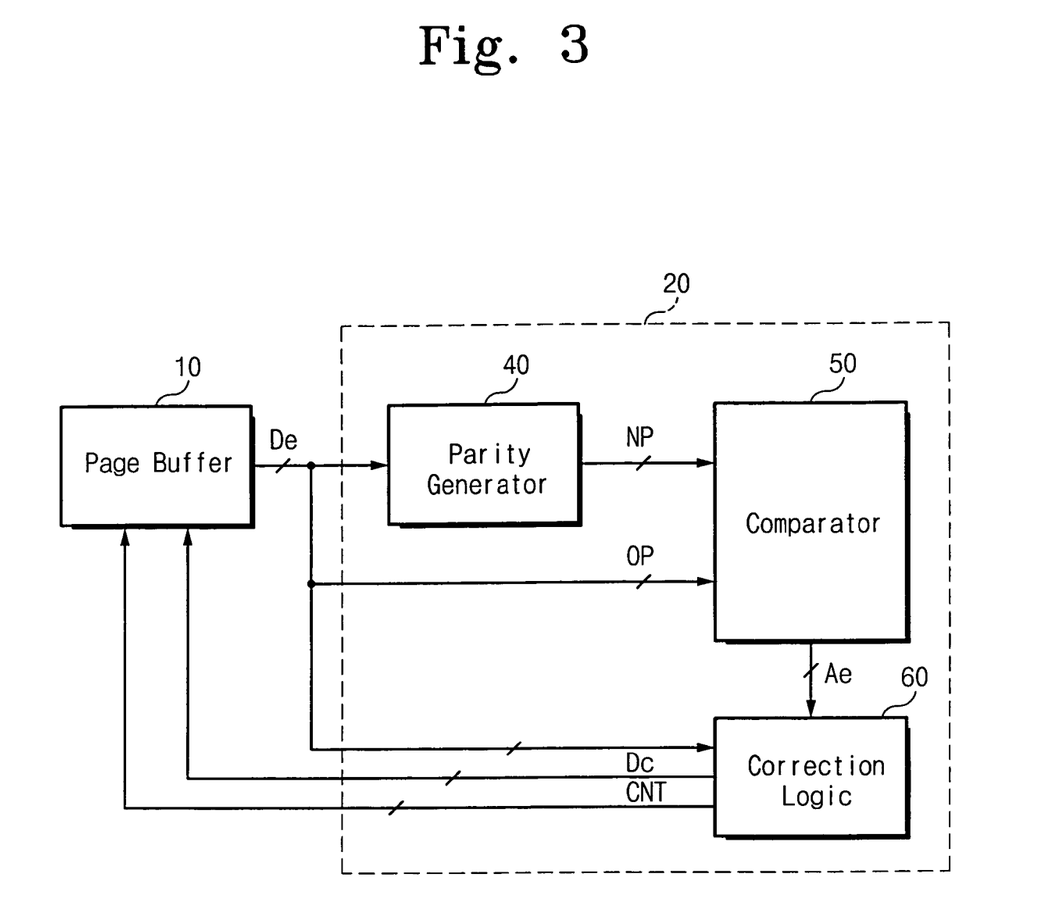
FIG. 3 is a block diagram illustrating an error correction circuit according to embodiments of the present invention.

FIG. 3 illustrates a functional structure for conducting the error correction during the page copy operation. Referring to FIG. 3, once the source data De temporally stored in the page buffer 10 are provided to the error correction circuit 20, a comparator 50 compares old parities OP, which have been created during the former programming (or writing) cycle and stored in a predetermined field of the memory, with new parities NP that are generated by a parity generator 40 during the copy operation. The new parities NP are parity data to be used to correct a bit error, i.e., a progressive bit error generated during the page copy operation with the source data. The old and new parities, OP and NP, are generated by the same manner. After comparing the old parities OP with the new parities NP, an information signal Ae of the page address involved in the progressive bit error is generated from the comparator 50. The erroneous address information signal Ae is applied to an error correction logic circuit 60 to cure the bit error. The amended data Dc from the error correction logic circuit 60 are transferred to the page buffer 10 together with control signals CNT therefrom. More details about the parity generation and comparison is described hereinbelow.

Figure 4:
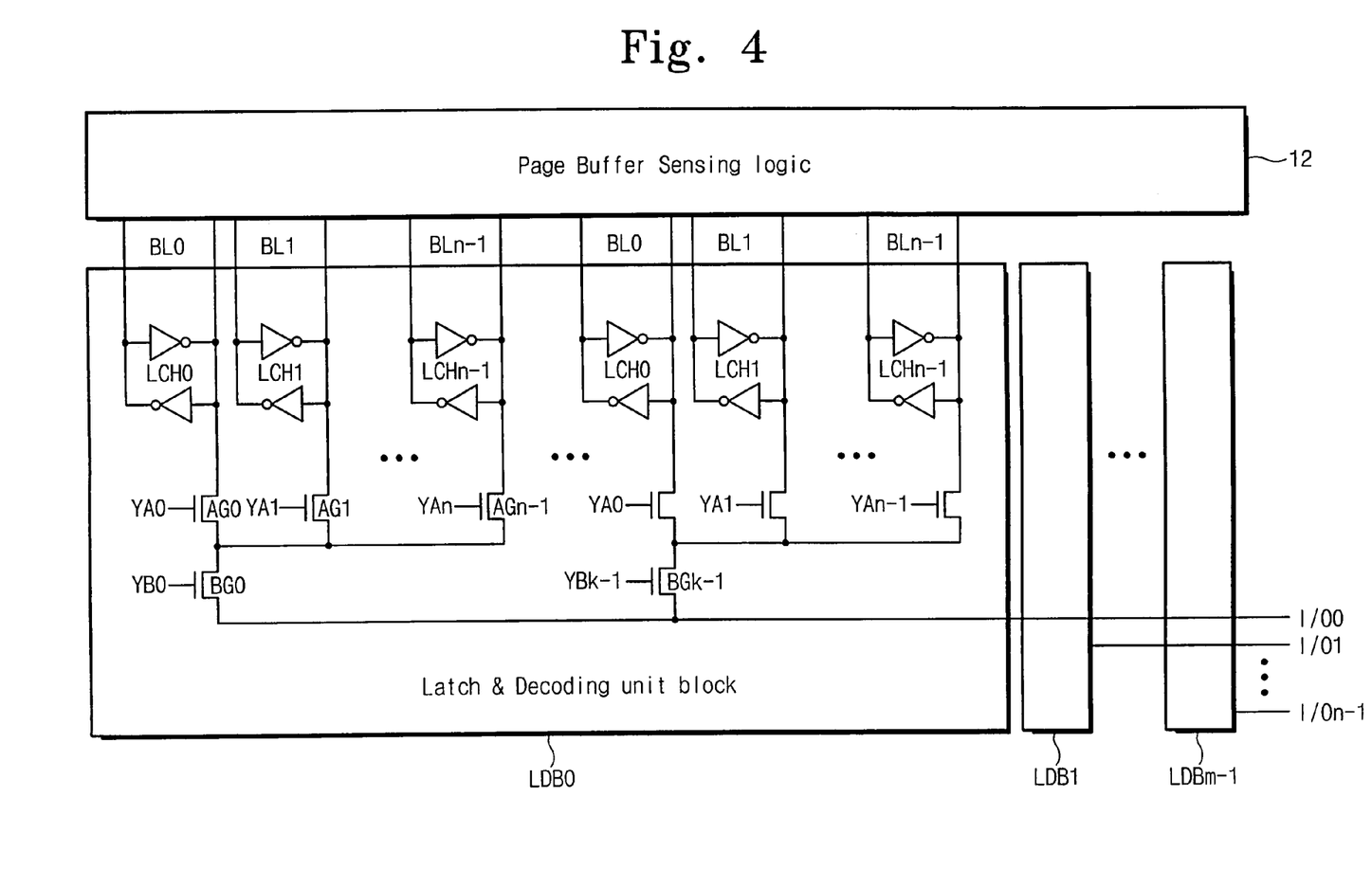
FIG. 4 is a circuit diagram illustrating gating circuits for performing data transmission between page buffers and the error correction circuit of FIG. 3.

FIG. 4 is a circuit diagram of latching and column-decoding blocks LDB0~LDBm-1, being disposed between the page buffering and sensing logic block 12 (included in the page buffer 10) and input/output lines I/O0~I/On-1, for transferring the source and correct data. Referring to FIG. 4, the source data of the source page (e.g., PG4) assigned to a specific address are transferred to the error correction circuit 20 from the page buffering and sensing block 12 through the latching and column-decoding blocks LDB0~LDBm-1 each corresponding to the input/output lines I/0~I/On-1. The latching and column-decoding blocks LDB0~LDBm-1 also transfers the amended data Dc provided from the error correction circuit 20 to the transcript page (e.g., PGn-1) through the page buffering and sensing block 12.

Figure 5:
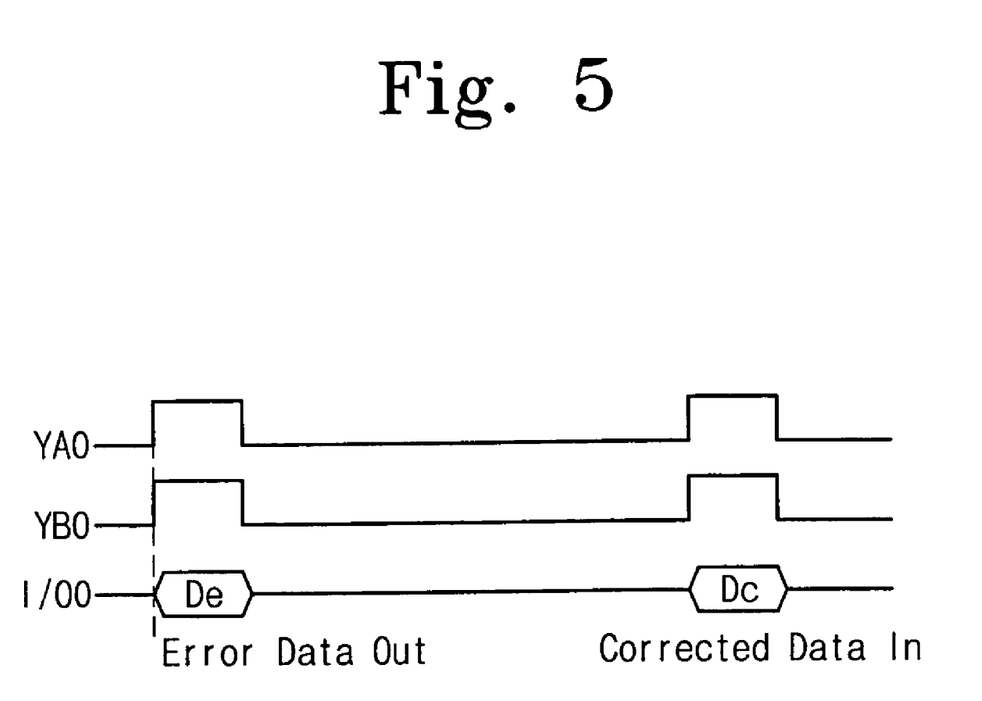
FIG. 5 is a timing diagram of data transmission between the page buffers and the error correction circuit of FIG. 3.

The source data De of the source page PG4 are read by the page buffering and sensing block 12 and stored in latches LCH0~LCHn-1 each corresponding to the bitlines BL0~BLn-1. The source data staying at the latches LCH0~LCHn-1 are transferred to the input/output lines I/O0~I/On-1 through column gates (or Y-gates) AG0~AGn-1 and BG0~BGk-1 in response to column gating signals YA0~YAn-1 (primary) and YB0~YBk-1 (secondary) by a unit of bit sequentially, as shown in FIG. 5, which may be referred to as "error-data out" as an operational state. For instance, a source data bit corresponding to the bitline BL0 is transferred to the error correction circuit 20 through the input/output line I/O0 when both of the column gating signals YA0 and YB0 are active with high levels.

The amended data Dc are transferred through the input/output lines I/O0~I/On-1 from the error correction circuit 20 to the latches LCH0~LCHn-1 each coupled to the bitlines BL0~BLn-1, which may be referred to as "amended-data in" as an operational state.

For instance, an amended data bit corresponding to the bitline BL0 is transferred to the page buffer 10 (i.e., the page buffering and sensing block 12) through the input/output line I/O0 when both of the column gating signals YA0 and YB0 are active with high levels. The amended data Dc temporarily stored in the latches are written into the transcript page PGn-1 by way of a programming process.

Figure 6:
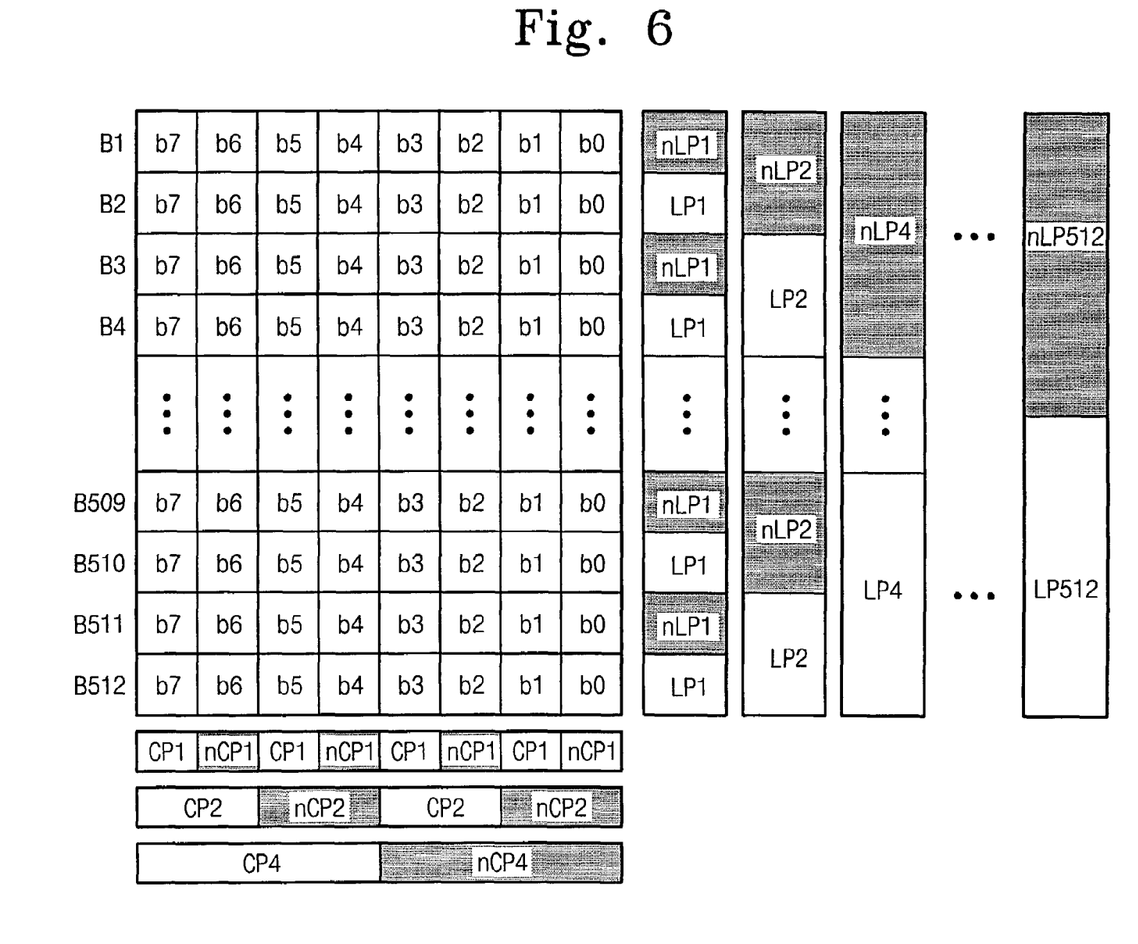
FIG. 6 is a table illustrating a procedure of generating column and line parities according to embodiments of the invention.

FIG. 6 shows a practical fashion of generating the new parities NP according to embodiments of the present invention. The old parities OP are previously stored in a predetermined field of the memory, which were made in a former programming operation.

Known techniques for generating parities are briefly divided into two ways: one is a serial way and the other is a parallel way. Embodiments of the present invention employs the serial way in order to save a topological circuit area, but either embodiment is acceptable.

Illustrating that the source data De from which the parities are established is composed of 8-bits by 512-bytes, the parities are classified into column parities and line parities. The column parities are obtained from the 8 bits of one byte, while the line parities from the 512 bytes.

Figure 7:
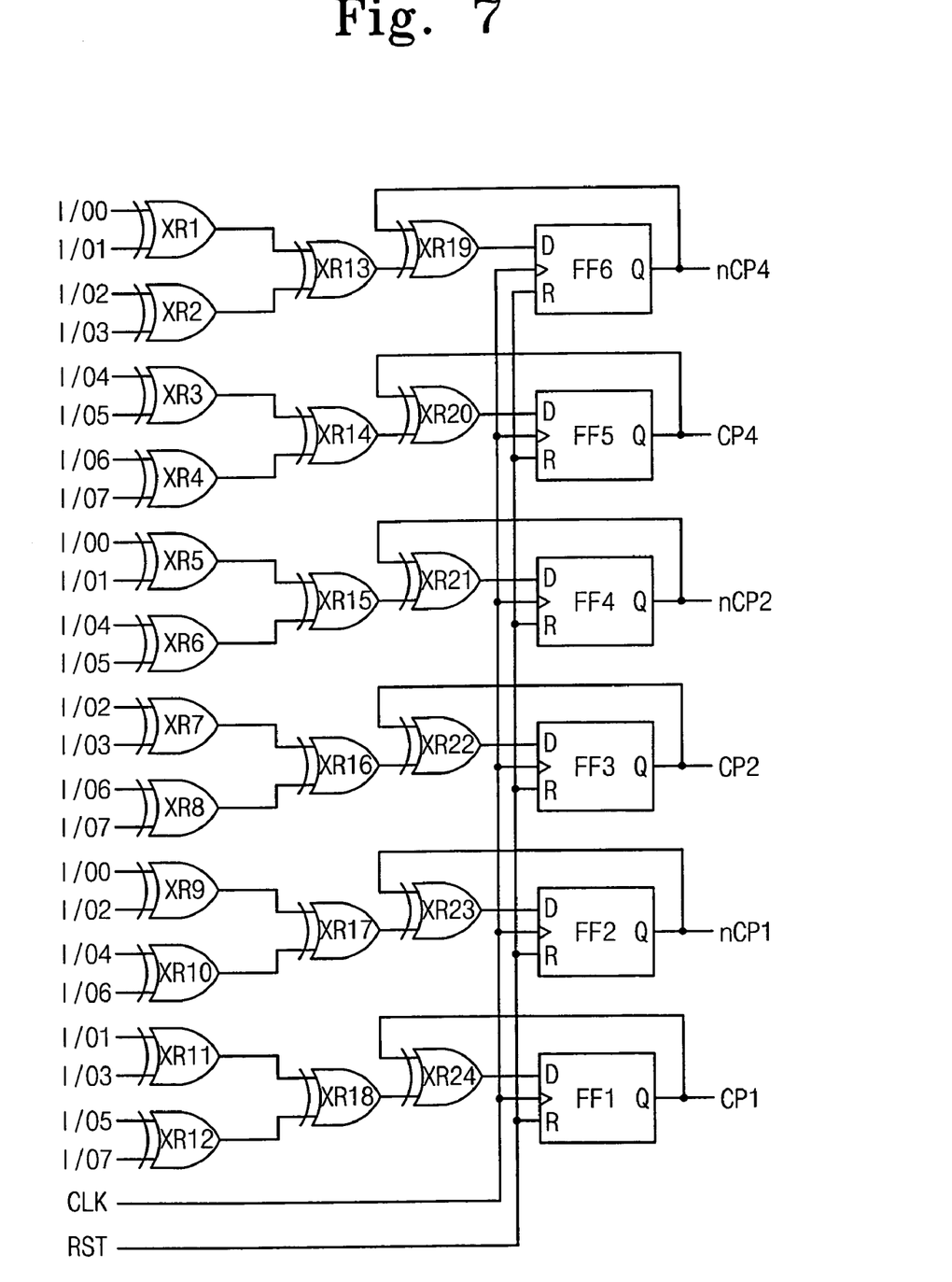
FIG. 7 is a circuit diagram illustrating a circuit for generating the column parities shown in FIG. 6.
Figure 8:
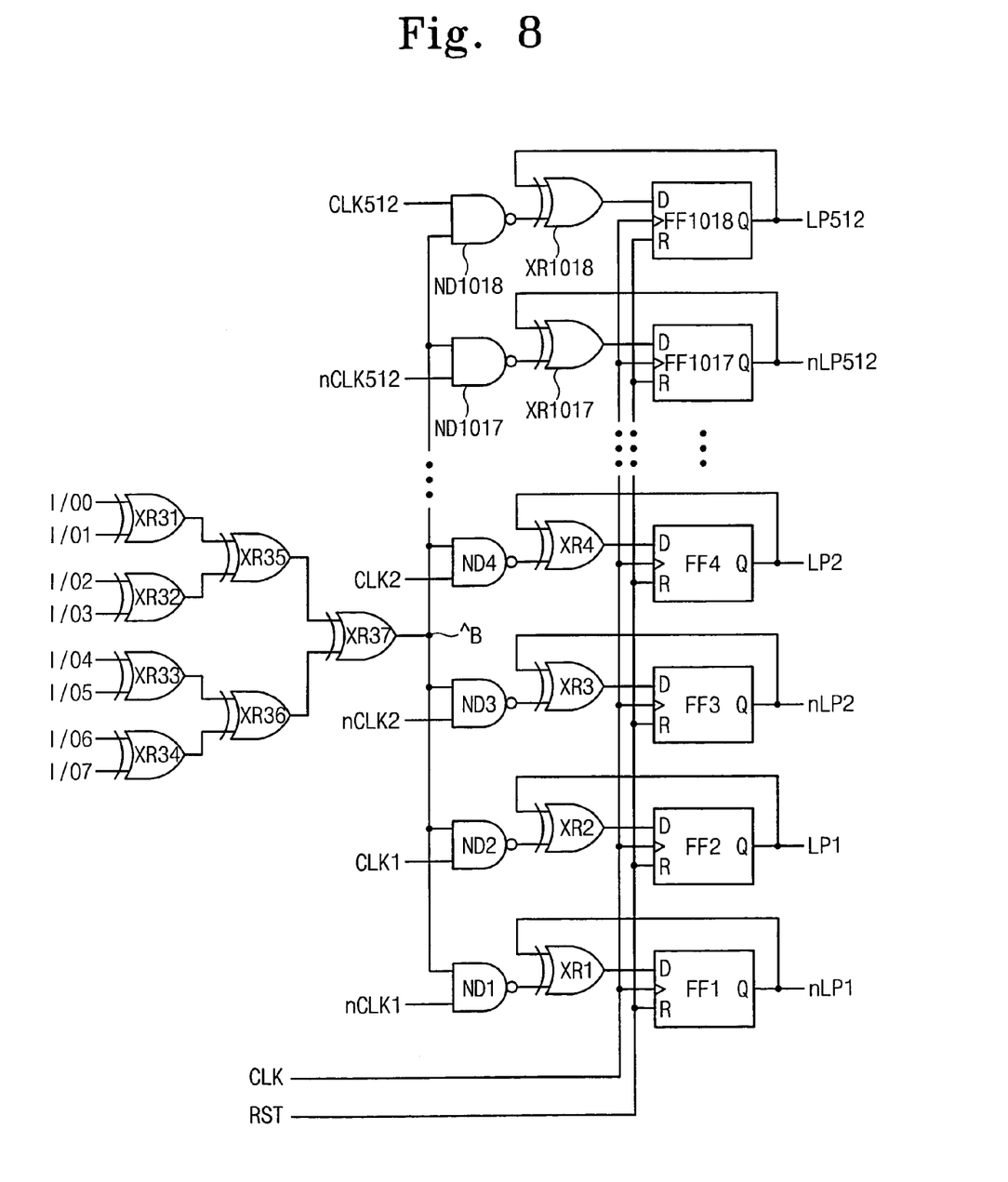
FIG. 8 is a circuit diagram illustrating a circuit for generating the line parities shown in FIG. 6.

The column and line parities can be made in the circuits shown in FIGS. 7 and 8 respectively, both circuits being included in the parity generator 40 shown in FIG. 4. The generation of the column and line parities is accomplished by conducting exclusive-OR (XOR) logic chains with binary combinations to obtain a bit error from the packages of bits or bytes.

Now will be described about creating the column parities from the eight bits b0~b7 with reference to FIGS. 6 and 7 and Table 1 following.

TABLE 1

| Column Parity | Arithmetic Combination | |
|---|---|---|
| | b7 b6 b5 b4 | b3 b2 b1 b0 |
| CP1 | * *  | * * |
| nCP1 | * * | * * |
| CP2 | * * | * * |
| nCP2 | * * | * * |
| CP4 | * * * * | |
| nCP4 | | * * * * |

The letter "*" represents the XOR operator to obtain the comparison result from the relevant bit combination. Therefore, complete arithmetic equations of the XOR logic are summarized as follows each for the column parities of six bits.

$$CP1 = b7*b5*b3*b1$$

$$nCP1 = b6*b4*b2*b0$$

$$CP2 = b7*b6*b3*b2$$

$$nCP2 = b5*b4*b1*b0$$

$$CP4 = b7*b6*b5*b4$$

$$nCP4 = b3*b2*b1*b0$$

Referring to FIG. 7, implementing the arithmetic combinations to generate each column parity is associated with four XOR gates XR and one flipflop FF. Each input/output line corresponds to each data bit. The column parity nCP4 is generated from a flipflop FF6 receiving an output of an XOR gate XR19. The gate XR19 receives an output of an XOR gate XR13 and the column parity nCP4 fed-back thereto from the flipflop FF6. The gate XR13 receives outputs of XOR gates XR1 and XR2. The input/output lines I/O2 and I/O3 are coupled to inputs of the gate XR2, while the input/output lines I/O0 and I/O1 to inputs of the gate XR1. The column parity CP4 complementary to the nCP4 is generated from a flipflop FF5 receiving an output of an XOR gate XR20. The gate XR20 receives an output of an XOR gate XR14 and the column parity CP4 fed-back thereto from the flipflop FF5. The gate XR14 receives outputs of XOR gates XR3 and XR4. The input/output lines I/O4 and I/O5 are coupled to inputs of the gate XR3, while the input/output lines I/O6 and I/O7 to inputs of the gate XR4.

The column parity nCP2 is generated from a flipflop FF4 receiving an output of an XOR gate XR21. The gate XR21 receives an output of an XOR gate XR15 and the column parity nCP2 fed-back thereto from the flipflop FF4. The gate XR15 receives outputs of XOR gates XR5 and XR6. The input/output lines I/O0 and I/O1 are coupled to inputs of the gate XR5, while the input/output lines I/O4 and I/O5 to inputs of the gate XR6. The column parity CP2 complementary to the nCP2 is generated from a flipflop FF3 receiving an output of an XOR gate XR22. The gate XR22 receives an output of an XOR gate XR16 and the column parity CP2 fed-back thereto from the flipflop FF3. The gate XR16 receives outputs of XOR gates XR7 and XR8. The input/output lines I/O2 and I/O3 are coupled to an input of the gate XR7, while the input/output lines I/O6 and I/O7 to an input of the gate XR8.

The column parity nCP1 is generated from a flipflop FF2 receiving an output of an XOR gate XR23. The gate XR23 receives an output of an XOR gate XR17 and the column parity nCP1 fed-back thereto from the flipflop FF2. The gate XR17 receives outputs of XOR gates XR9 and XR10. The input/output lines I/O0 and I/O2 are coupled to inputs of the gate XR9, while the input/output lines I/O4 and I/O6 to inputs of the gate XR10. The column parity CP1 complementary to the nCP2 is generated from a flipflop FF1 receiving an output of an XOR gate XR24. The gate XR24 receives an output of an XOR gate XR18 and the column parity CP1 fed-back thereto from the flipflop FF1. The gate XR18 receives outputs of XOR gates XR11 and XR12. The input/output lines I/O0 and I/O3 are coupled to an input of the gate XR11, while the input/output lines I/O5 and I/O7 to an input of the gate XR12.

A clock signal CLK and a reset signal RST are applied to the flipflops FF1~FF6 in common. Thus, the flipflops FF1~FF6 outputs the column parities in response to rising edges of every cycle of the clock signal CLK. The feedback input of each column parity to the XOR gate positioned before its corresponding flipflop (e.g., nCP4 to XR19 from FF6) is directed to detect the variation between a current bit and the next bit in the source data (i.e., to detect a progressive bit error during the page copy operation) and then to manage it with the serial way of parity generation.

As a practical example in the column parity generation, the column parities CP1, CP2 and nCP4 will be set to "1", provided the bit b3 is an error bit.

The generation of the line parities from the 512 bytes will be described with reference to FIGS. 6 and 8 and the following Table 2. Table 2 arranges byte combinations for XOR arithmetic implements in order to obtain the line parities LP1, nLP1, LP2, nLP2, LP4, nLP4 . . . , LP512, and nLP512 (LP1~nLP512; 18 bits) against the 512 bytes of the source data.

TABLE 2

| Line Parity | ^B512 | ^B511 ^B510 ^B509 | ... | ^B256 | ^B255 ^B254 | ^B253 | ... | ^B4 | ^B3 ^B2 | ^B1 |
|---|---|---|---|---|---|---|---|---|---|---|
| LP1 | * | * | ... | * | * |  | ... | * | * |  |
| nLP1 |  | ** | ... |  | * | * | ... |  | * | * |
| LP2 | * | * | ... | * | * |  | ... | * | * |  |
| nLP2 |  | ** | ... |  | * | * | ... |  | * | * |
| LP4 | * | *** | ... | * | ** | * | ... |  |  |  |
| nLP4 |  |  | ... |  |  |  | ... | * | ** | * |
| . |  |  |  |  |  |  |  |  |  |  |
| LP512 | * | *** | ... |  |  |  | ... |  |  |  |
| nLP512 |  |  | ... | * | ** | * | ... | * | ** | * |

In Table 2, the letter "*" notes the XOR operator to obtain the comparison result from the relevant bit combination, and "^B" represents a result of an XOR operation for eight bits of their corresponding byte (e.g., ^B512=b7*b6*b5*b4*b3*b2*b1*b0 in the 512'th byte). The factor ^B will be referred to as "byte parity unit" hereinafter. Therefore, complete arithmetic equations of the XOR logic from Table 2 are summarized as follows each for the line parities of 18 bits.

```
LP1 = ^B512 * ^B510 * . . . *^B 256 * ^B254 * . . . * ^B4 * ^B2
nLP2 = ^B511 * ^B509 * . . . *^B 255 * ^B253 * . . . * ^B3 * ^B1
LP2 = ^B512 * ^B511 * . . . *^B 256 * ^B255 * . . . * ^B4 * ^B3
nLP2 = ^B510 * ^B509 * . . . *^B 254 * ^B253 * . . . * ^B2 * ^B1
LP4 = ^B512 * ^B511 * ^B510 * ^B509 * . . . * ^B256 * ^B255 * ^B254 * ^B253
* . . . * ^B8 * ^B7 * ^B6 * ^B5
nLP4 = ^B508 * ^B507 * ^B506 * ^B505 * . . . * ^B252 * ^B251 * ^B250 * ^B249
* . . . * ^B4 * ^B3 * ^B2 * ^B1
.
.
LP512 = ^B512 * ^B511 *^B510 * ^B509 * . . . * ^B260 * ^B259
* ^B258 * ^B257
nLP512 = ^B256 * ^B255 *^B254 * ^B253 * . . . * ^B4 * ^B3
* ^B2 * ^B1
```

Referring to FIG. 8, the byte parity unit ˆB for each byte is first obtained through XOR gates XR31~XR37. The byte parity unit ˆB is generated from the gate XR37. The gate XR37 receives outputs of the gates XR35 and XR36. The gate XR35 receives outputs of the gates XR31 and XR32, and the gate XR36 receives outputs of the gates XR33 and XR34. Inputs of the gate XR31 are coupled to the input/output lines I/O0 and I/O1, and inputs of the gate XR32 are coupled to the input/output lines I/O2 and I/O3. Inputs of the gate XR33 are coupled to the input/output lines I/O4 and I/O5, and inputs of the gate XR34 are coupled to the input/output lines I/O6 and I/O7.

The output of the gate XR37, ˆB, is branched into 18 ways to establish the 18 line parities LP1~nLP512, being applied to inputs of NAND gates ND1~ND18 in common. If there is an error bit among the eight bits of their corresponding byte, the byte parity unit ˆB is set to "1". The NAND gates ND1~ND18 respond each to clock control signals nCLK1, CLK1, nCLK2, CLK2, . . . , nCLK512, and CLK512 (nCLK1~CLK512; 18 ea) to control bit paths from the byte parity unit ˆB to the line parities. Outputs of the NAND gates ND1~ND18 are applied to inputs of XOR gates XR1~XR18 respectively. The gates XR1~XR18 also receive the line parities nLP1~LP 18 fed-back thereto from flipflops FF1~FF18 receiving outputs of the gates XR1~XR18, respectively.

As the clock signal CLK and the reset signal RST are applied to the flipflops FF1~FF18 in common, the flipflops FF1~FF18 outputs the line parities in response to rising edges of every cycle of the clock signal CLK. The feedback input of each column parity to the XOR gate positioned before its corresponding flipflop (e.g., LP512 to XR1018 from FF 1018) is directed to detect the variation between a current bit and the next bit in the source data (i.e., to detect a progressive bit error during the page copy operation) and then to manage it with the serial way of line parity generation. As a practical example in the line parity generation, if the byte B3 has an error bit, the line parities nLP1, LP2, nLP4, . . . , nLP512 will be set to "1".

Figure 9:
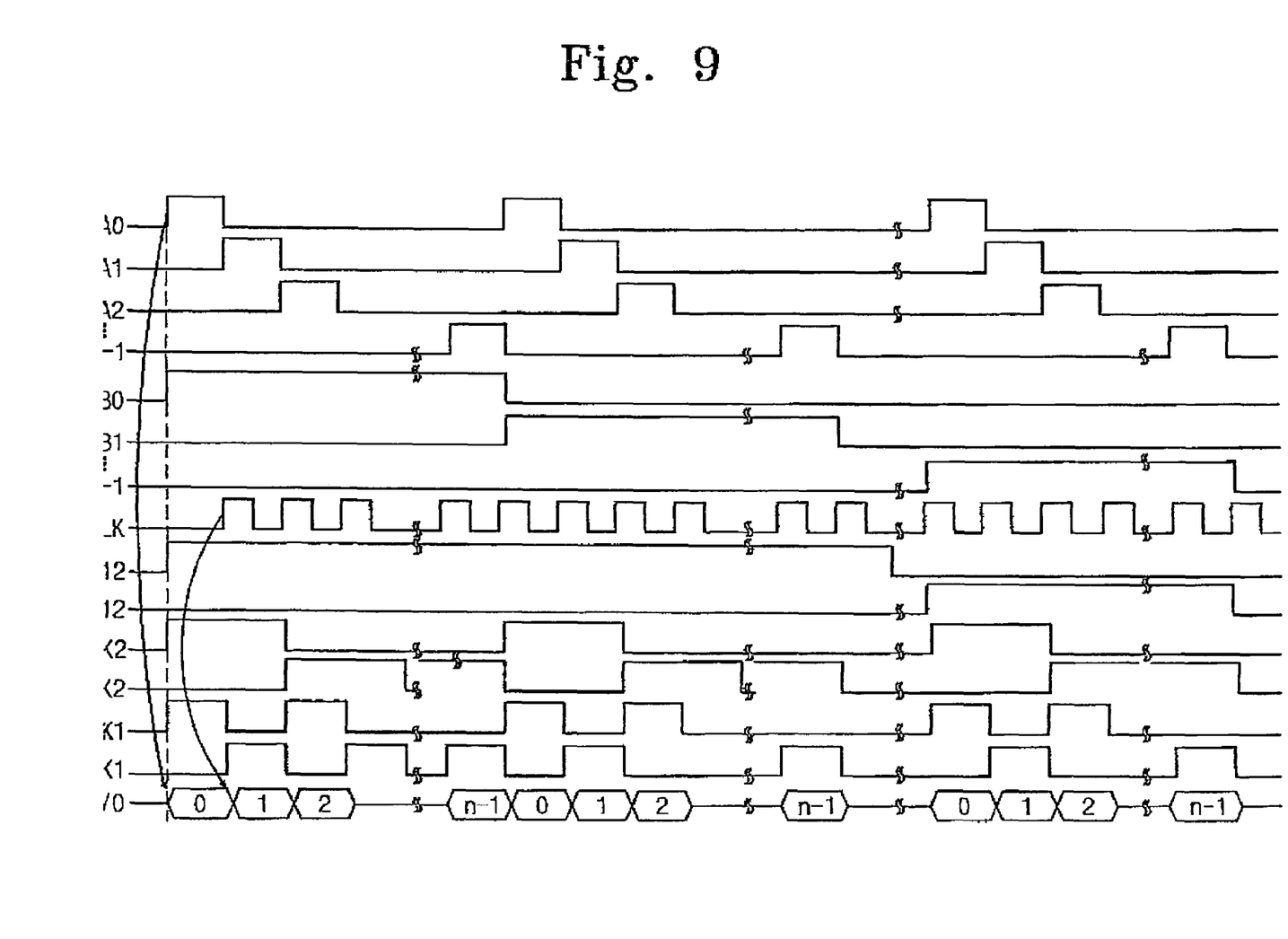
FIG. 9 is a timing diagram of signals used in data transmission between the page buffers and the error correction circuit.

The timing diagram of FIG. 9 shows pulsing states of the column gating signals and clock control signals for transferring the source data from the page buffer 10 to the error correction circuit 20, associated with the operations in the circuits of FIGS. 4 through 8. The transmission procedure shown in FIG. 9 is exemplarily carried out by way of the latching and column-decoding block LDB1 shown in FIG. 4.

Referring to FIG. 9, as the primary column gating signals YA0~YAn-1 are successively active with high levels for the secondary column gating signal YB0 is being enabled with a high level, data bits corresponding to the bitlines BL0~BLn-1 are sequentially transferred to the error correction circuit 20 through their corresponding input/output lines I/O0~I/On-1. By the same manner, in accordance with the sequential activation of the primary column gating signals YA0~YAn-1 for each active state of the secondary column gating signals YB0~YBk-1, all the 512 bytes of the source data are transferred to the error correction circuit 20 through the input/output lines I/O0~I/On-1.

In the error correction circuit 20, responding to the periodic oscillation of the clock signal CLK, the flipflops FF1~FF6 of the column parity generator shown in FIG. 7 output the column parities CP1~nCP4. At the same time, the clock control signals CLK1~nCLK512 demultiplied from the clock signal CLK enable the bit paths to be conductive through the NAND gates ND1~ND18 of the line parity generator shown in FIG. 8, and the flipflops FF1~FF18 of the line parity generator outputs the line parities LP1~nLP512 of 18 bits.

The bit number of the new parities NP is 24 that is composed of the eight column parities CP1~nCP4 and the eighteen line parities LP1~nLP512, which is the same with the old parities OP that have been stored in a predetermined field of the flash memory. An overall sequence for carry out the page copy operation with the error correction is as follows.

First, the old parities OP are generated and stored in a predetermined field of the memory during a programming period. After then, the new parities NP are generated by the circuits and procedure aforementioned as shown in FIGS. 6 through 8. The old and new parities are compared from each other by 24 bits.

In comparing the old parities OP with the new parities NP by the parity comparator 50, if all 24 bits of the old and new parities are identical (i.e., the XOR operations with the old and new parities result in "0"), it is regarded as no error bit. On the other hand, it is regarded as one-bit error when the comparison result is "1" for 12 bits (a half of the 24 bits) between the old and new parities. Such a one-bit error is cured by the correction logic circuit 60. Otherwise, only a comparison result for one bit among the 24 bits becomes "1", it is regarded as a single error that has been already contained in the source data of the page to be copied. Other case except the former cases of comparison results may be regarded as there are more than two error bits.

Such bit error conditions may be available to be identified by a user in response to a command. Further, it may be practicable to transcribe the amended data into the source page as well as the transcription page.

The error correction circuit may be embedded in the flash memory according to embodiments of the present invention.

As described above, since an error bit contained in the source data of a source page is detected and cured by the error correction circuit before being written into a transcription page, it prevents the error bit of the source data from being transcribed into the transcription page.

Moreover, the flash memory according to present invention efficiently eliminates a progressive bit error that could occur during a page copy operation.

And, according to the embodiment aforementioned, there is no need of buffering components for error correction during a page copy operation because the page buffer, which is basically employed in a normal flash memory, is efficiently usable to assist the operation without additional modifications.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:
1. A nonvolatile memory comprising:
a plurality of pages storing data;
a page buffer temporarily storing data by the page;
a correction circuit for correcting a bit error of source data of a specific one of the pages;
a transferring circuit configured to provide the source data to the correction circuit from the page buffer and to provide amended data to the page buffer from the correction circuit after the correction circuit has corrected the bit error; and a replicating circuit configured to copy the source data into the page buffer and to store the amended data into another page from the page buffer;

wherein:
the source data contains old parities;
the correction circuit for generating new parities from the source data, and compares the new parities with the old parities;
the correction circuit comprises a circuit for generating column parities for bits composing one byte of the source data; and a circuit for generating line parities for bytes of the source data; and
for a one bit error in the source data, the line parities indicate a binary weighted line address and its complement of the one bit error in the page buffer, and the column parities indicate a binary weighted column address and its complement of the one bit error in the page buffer.

2. The nonvolatile memory of claim 1, wherein the nonvolatile memory is a NAND flash memory.

3. A nonvolatile memory comprising:
a data field composed of a plurality of pages for storing data;
a first storage configured to store first parities in a predetermined region of the data field, the first parities being generated during a programming operation for the page;
a page buffer for temporarily storing data by the page;
a moving circuit configured to copy source data stored in a first one of the pages into the page buffer;
a parity circuit configured to generate second parities from the source data stored in the page buffer;
a correction circuit configured to generate modified data from the source data in response to a result of comparing the first parities with the second parities; and
a transfer circuit configured to transfer the modified data of the source data to the page buffer;

wherein:
the moving circuit is further configured to copy the modified data in the page buffer to a second one of the pages after the correction circuit has generated the modified data;
the parity circuit comprises a circuit for generating column parities for bits composing one byte of the source data; and a circuit for generating line parities for bytes of the source data; and
for a one bit error in the source data, the line parities indicate a binary weighted line address and its complement of the one bit error in the page buffer, and the column parities indicate a binary weighted column address and its complement of the one bit error in the page buffer.

4. The nonvolatile memory of claim 3, wherein the second parities comprise column parities and line parities.

5. The nonvolatile memory of claim 3, wherein the nonvolatile memory is a NAND flash memory.

6. A method of transferring source data of a first page to a second page in a nonvolatile memory having a page buffer structured to temporarily store data by the page, the source data containing old parities, the method comprising:
storing the source data from the first page into the page buffer;
generating new parities from the source data stored in the page buffer;
comparing the old parities with the new parities;
creating modified data from the source data in response to a result of the comparing;-and
moving the modified data to the page buffer after the creation of the modified data; and
storing the modified data in the page buffer in the second page;

wherein:
storing the source data into the page buffer further comprises storing the source data into a plurality of lines and a plurality of columns of the page buffer; and
generating new parities from the source data stored in the page buffer further comprises generating the new parities including:
a plurality of pairs of line parities, for each line parity pair, a first line parity associated with a first half of the lines, and a second line parity associated with a second half of the lines; and
a plurality of pairs of column parities, for each column parity pair, a first column parity of the pair associated with a first half of the columns, and a second column parity of the pair associated with a second half of the columns;
wherein for a one bit error in the source data, the line parities indicate a binary weighted line address and its complement of the one bit error in the page buffer, and the column parities indicate a binary weighted column address and its complement of the one bit error in the page buffer.

7. The method of claim 6, further comprising storing the old parities of the source data into a predetermined field of the memory before storing the source data into the page buffer.

8. The method of claim 6, further comprising informing an error status by the comparing result of the outside of the memory.

9. A nonvolatile memory comprising:
a data storage field composed of a plurality of pages storing data;
a page buffer for storing data of a first one of the pages, being connected to the data storage field;
an error correction circuit including: a bit error detection circuit configured to detect a bit error of the data of the specific page; and a bit error correction circuit configured to amend the bit error;
a transfer circuit coupled to the page buffer and the error correction circuit, and configured to transfer amended data from the error correction circuit to the page buffer after the bit error correction circuit has amended the bit error; and
a moving circuit coupled to the page buffer and the data storage field, the moving circuit configured to store the amended data in the page buffer in a second one of the pages after the transfer circuit has transferred the amended data to the page buffer;

wherein:
the data of the specific page contains old parities;
the error correction circuit is configured to generate new parities from the data of the specific page, and to compare the new parities with the old parities;
the error correction circuit comprises a circuit for generating column parities for bits composing one byte of the data of the specific page; and a circuit for generating line parities for bytes of the data of the specific page; and
for a one bit error in the data of the specific page, the line parities indicate a binary weighted line address and its complement of the one bit error in the page buffer, and the column parities indicate a binary weighted column address and its complement of the one bit error in the page buffer.

10. The nonvolatile memory of claim 9, wherein the bit error detection circuit comprises:
   a parity generator for creating new parities from the data stored in the page buffer; and
   a comparator for generating error address information by comparing the new parities with old parities of the data.

11. The nonvolatile memory of claim 10, wherein the error address information is referred by the bit error correction circuit to correct the data and to transfer amended data to the page buffer.

12. The nonvolatile memory of claim 11, wherein the transfer of the amended data is managed by control signals.

13. The nonvolatile memory of claim 12, wherein the moving circuit is further configured to store the amended data in the first page.

14. The nonvolatile memory of claim 9, wherein the nonvolatile memory is a NAND flash memory.

15. The method of claim 6, wherein generating the new parities further comprises:
   for each column parity:
      resetting a parity accumulator associated with the column parity; and
      for each line of the page buffer:
         generating a result of an exclusive-or operation on bits of the line in columns associated with the column parity; and
         updating the parity accumulator with the result.

16. The method of claim 15, wherein generating the new parities further comprises:
   resetting a parity accumulator for each line parity; and
   for each line of the page buffer:
      generating a result of an exclusive-or operation on bits of the line; and
      for each line parity associated with the line:
         updating the parity accumulator associated with the line parity.

17. A nonvolatile memory comprising:
   a data storage field composed of a plurality of pages, each page configured to store data and first error correction information associated with the data;
   a page buffer coupled to the data storage field, and configured to store a page of data in a plurality of lines and a plurality of columns, and configured to store the associated first error correction information;
   a parity generator coupled to the page buffer, and configured to generate second error correction information from the data stored in the page buffer, the parity generator including:
      a line parity circuit coupled to the page buffer and configured to generate a plurality of pairs of line parities, for each line parity pair, a first line parity associated with a first half of the lines, and a second line parity associated with a second half of the lines; and
      a column parity circuit coupled to the page buffer and configured to generate a plurality of pairs of column parities, for each column parity pair, a first column parity of the pair associated with a first half of the columns, and a second column parity of the pair associated with a second half of the columns;
      wherein the second error correction information includes the pairs of line parities and the pairs of column parities, and for a one bit error in the source data, the line parity pairs indicate a binary weighted line address and its complement of the one bit error in the page buffer, and the column parity pairs indicate a binary weighted column address and its complement of the one bit error in the page buffer;
   a comparator coupled to the page buffer and the parity generator, and configured to compare the first error correction information to the second error correction information to generate an address information signal; and
   an error correction logic circuit coupled to the page buffer and the comparator, and configured to generate amended data and control signals in response to the address information signal and the data;
   wherein the page buffer is configured to amend the stored page in response to the amended data and control signals.

18. The non volatile memory of claim 17, wherein:
   the column parity circuit further comprises, for each column parity:
      an exclusive-or logic circuit configured to receive bits from the associated half of the columns and generate a result of an exclusive-or operation on bits from the associated half of the columns; and
      a parity accumulator including:
         a flip flop having an input and an output; and
         an exclusive-or gate having a first input coupled to the output of the flip flop, a second input to receive the result of the exclusive-or operation on the bits from the associated half of the columns, and an output coupled to the input of the flip flop;
   the line parity circuit further comprises:
      an exclusive-or logic circuit configured to generate a result of an exclusive-or operation on bits from a selected one of the lines;
      for each line parity, a parity accumulator including:
         a flip flop having an input and an output;
         an exclusive-or gate having a first input coupled to the output of the flip flop, a second input, and an output coupled to the input of the flip flop; and
         a gate having a first input configured to receive an associated clock control signal, a second input coupled to the output of the exclusive-or logic circuit, and an output coupled to the second input of the exclusive-or gate; and
   the page buffer further comprises:
      a buffering and sensing logic block coupled to the data storage field and including a plurality of bitlines;
      a plurality of unit blocks, each unit block including:
         an input/output line;
         a plurality of latches, each latch coupled to an associated bitline of the buffering and sensing logic block; and
         a plurality of column gates coupled to the latches and configured to selectively couple one of the latches to the input/output line in response to a plurality of column gating signals;
      wherein the input/output lines of the unit blocks are coupled to the error correction circuit.

19. The non volatile memory of claim 18, further comprising:
   control signal generator coupled to the first inputs of the gates and the column gates, the clock control signal generator configured to generate the clock control signals associated with the gates and the column gating signals;

wherein the control signal generator is configured to generate the clock control signals associated with gates associated with a line indicated by the column gating signals.

20. The nonvolatile memory of claim 1, wherein the page buffer includes only one register.

* * * * *

UNITED STATES PATENT AND TRADEMARK OFFICE
CERTIFICATE OF CORRECTION

PATENT NO. : 7,296,128 B2  
APPLICATION NO. : 10/817061  
DATED : November 13, 2007  
INVENTOR(S) : Jin-Yub Lee It is certified that error appears in the above-identified patent and that said Letters Patent is hereby corrected as shown below:

Column 5, line 25, the words "I/0~I/On-1." should read -- I/O0~I/On-1. --;  
Column 11, line 67, the words "comparing;-and" should read -- comparing; --;  
Column 12, line 1, the words "modi fled" should read -- modified --;  
Column 12, line 7, the word "aplurality" should read -- a plurality --.

Signed and Sealed this

Twenty-third Day of September, 2008

JON W. DUDAS  
*Director of the United States Patent and Trademark Office*